(12) United States Patent
Nakayama et al.

(10) Patent No.: US 9,105,803 B2
(45) Date of Patent: Aug. 11, 2015

(54) POLYCRYSTALLINE-TYPE SOLAR CELL PANEL AND PROCESS FOR PRODUCTION THEREOF

(75) Inventors: Ichiro Nakayama, Osaka (JP); Hitoshi Yamanishi, Osaka (JP); Yoshihisa Ohido, Osaka (JP); Nobuyuki Kamikihara, Nara (JP); Tomohiro Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 436 days.

(21) Appl. No.: 13/635,962

(22) PCT Filed: Jun. 17, 2011

(86) PCT No.: PCT/JP2011/003476
§ 371 (c)(1),
(2), (4) Date: Sep. 19, 2012

(87) PCT Pub. No.: WO2011/158514
PCT Pub. Date: Dec. 22, 2011

(65) Prior Publication Data
US 2013/0081694 A1    Apr. 4, 2013

(30) Foreign Application Priority Data

Jun. 17, 2010 (JP) ................. 2010-137947
Jun. 17, 2010 (JP) ................. 2010-137948
Jun. 17, 2010 (JP) ................. 2010-137949

(51) Int. Cl.
*H01L 31/18* (2006.01)
*H01L 31/0368* (2006.01)

(52) U.S. Cl.
CPC ........ *H01L 31/182* (2013.01); *H01L 31/03682* (2013.01); *Y02E 10/546* (2013.01)

(58) Field of Classification Search
None
See application file for complete search history.

(56) References Cited

U.S. PATENT DOCUMENTS

| 8,101,858 B2 | 1/2012 | Hannour et al. |
| 2002/0192933 A1 | 12/2002 | Nakata et al. |

(Continued)

FOREIGN PATENT DOCUMENTS

| JP | 06-268242 A | 9/1994 |
| JP | 11-186578 A | 7/1999 |

(Continued)

OTHER PUBLICATIONS

"In-plane Uniform Crystallization of Amorphous Silicon Film through Flash Lamp Annealing", Keisuke Ohira et al., 54th Scientific Lecture of Japan Society of Applied Physics (spring, 2007) (Optical Technology Information Magazine "Light Edge" No. 29 (Published Aug. 2007).

(Continued)

*Primary Examiner* — Seahvosh Nikmanesh
(74) *Attorney, Agent, or Firm* — Panasonic Patent Center

(57) ABSTRACT

Disclosed is a polycrystalline-type silicon solar cell which can be produced at low cost by forming a polycrystalline silicon film having a PN junction in a simple manner. Specifically, an amorphous silicon film produced by sputtering using a dopant-containing silicon target is polycrystallized with plasma, and a PN junction is formed in the amorphous silicon film, thereby producing a polycrystalline silicon film having a PN junction. The polycrystalline silicon film having a PN junction is used as a silicon substrate for a polycrystalline-type silicon solar cell. Also disclosed is a technique for producing a dopant-containing silicon target from a silicon ingot.

14 Claims, 8 Drawing Sheets

(56) References Cited

U.S. PATENT DOCUMENTS

2007/0261733 A1  11/2007  Hannour et al.
2011/0036394 A1  2/2011  Niira et al.

FOREIGN PATENT DOCUMENTS

| | | |
|---|---|---|
| JP | 2000-263545 A | 9/2000 |
| JP | 2000-279841 A | 10/2000 |
| JP | 2005-064134 A | 3/2005 |
| JP | 2008-053407 A | 3/2008 |
| JP | 2008-053632 | 3/2008 |
| JP | 2008-282921 A | 11/2008 |
| JP | 2011-525301 A | 9/2011 |
| KR | 10-2008-0104346 A | 12/2008 |
| WO | 2009/038323 | 3/2009 |
| WO | 2009/0099217 A1 | 8/2009 |
| WO | 2009/152368 A1 | 12/2009 |

OTHER PUBLICATIONS

International Search Report for Application No. PCT/JP2011/003476 dated Sep. 27, 2011.

FIG.3A
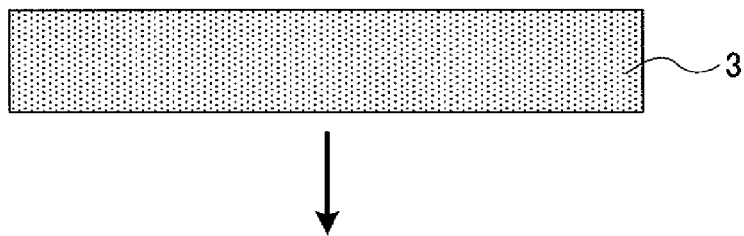
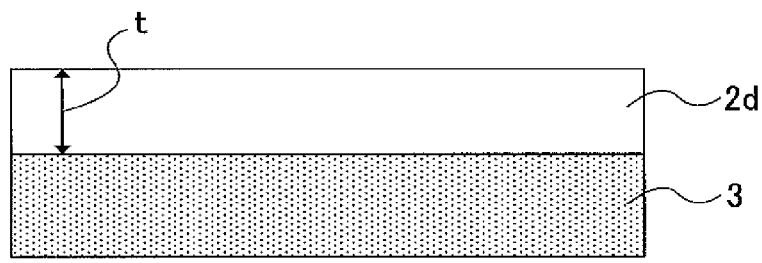
FIG.3B
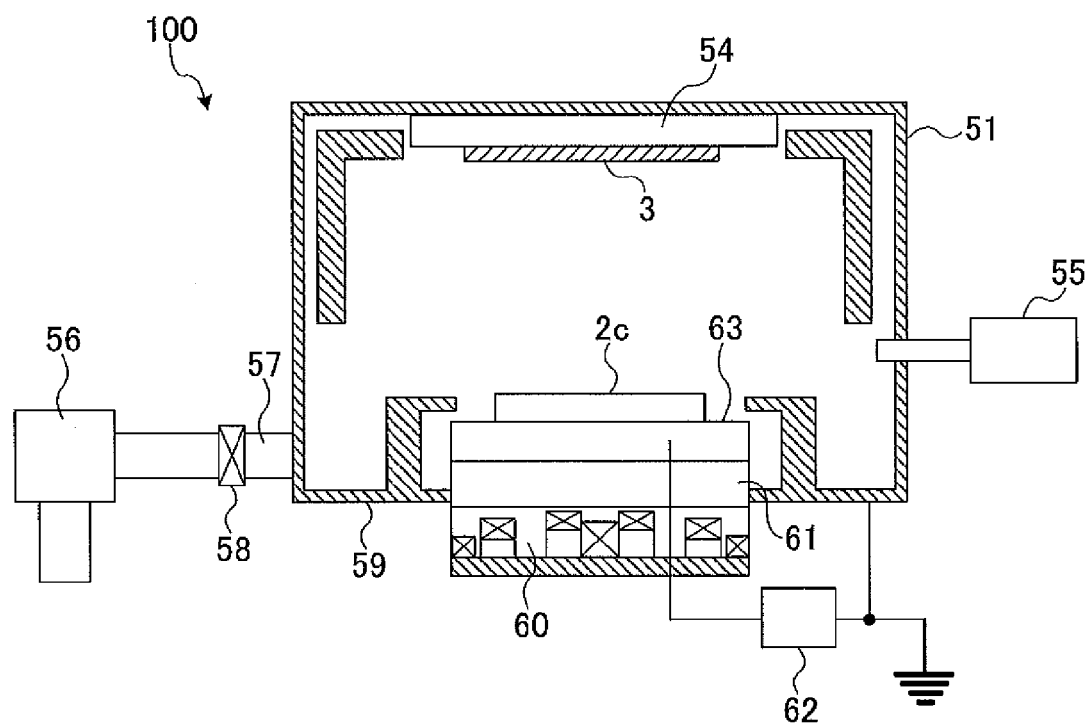
FIG.4

POLYCRYSTALLINE-TYPE SOLAR CELL PANEL AND PROCESS FOR PRODUCTION THEREOF

TECHNICAL FIELD

The present invention relates to a polycrystalline solar cell panel and a manufacturing method thereof.

BACKGROUND ART

Crystalline silicon solar cells are broadly classified into monocrystalline solar cells and polycrystalline solar cells. In general, in crystalline solar cells, as shown in FIG. 8, a silicon ingot 30 doped into an n type or a p type is cut with a wire 31 or is sliced to a thickness of about 200 μm using a dicing technique, and the sliced ingot is used as a silicon wafer serving as a main body of a solar cell (see PTL 1). The silicon ingot 30 may be a monocrystalline silicon ingot formed through a Czochralski method or the like or a polycrystalline silicon ingot which is solidified from a molten silicon cast through a casting method.

As a method of manufacturing a polycrystalline silicon film of a polycrystalline solar cell, a method in which silicon particles deposited on a support substrate are melted and poly-crystallized is known (see PTL 2). FIG. 9 shows an apparatus for forming a polycrystalline silicon film. Silicon particles 42 (20 nm or less) formed by applying an arc discharge 41 to a silicon positive electrode 40 are loaded on argon gas 43 and are deposited on the support substrate 45 via a transport pipe 44, the silicon particles 42 deposited on the support substrate 45 are irradiated with a high-temperature plasma 46 and are thus melted, an annealing process is performed thereon with a halogen lamp 47 to form a polycrystalline silicon plate, and the resultant is separated into the support substrate 45 and a polycrystalline silicon film 49 in a separation chamber 48.

A method of crystallizing amorphous silicon, which is deposited on a glass substrate through the use of a catalyst chemical vapor deposition (Cat-CVD) method, using a high-energy beam (flash lamp) has been studied (see PTL 3 and NPL 1). In PTL 3 and NPL 1, a Cr film serving as an electrode is formed on a quartz substrate with sides of 20 mm, amorphous silicon is deposited thereon in a thickness of 3 μm through the use of the Cat-CVD method and is processed with a flash lamp for 5 ms to form crystalline silicon.

CITATION LIST

Patent Literature

PTL 1
JP-A-2000-263545
PTL 2
JP-A-6-268242
PTL 3
JP-A-2008-53407
Non-Patent Literature
NPL 1
"In-plane Uniform Crystallization of Amorphous Silicon Film through Flash Lamp Annealing", Keisuke Ohira et al., 54th Scientific Lecture of Japan Society of Applied Physics (spring, 2007) (Optical Technology Information Magazine "Light Edge" No. 29 (Published August, 2007)

SUMMARY OF INVENTION

Technical Problem

A polycrystalline silicon solar cell includes a polycrystalline silicon film having a PN junction. When a PN junction is formed in a polycrystalline silicon film, 1) a dopant-containing material (generally glass) is deposited on the polycrystalline silicon film and the dopant is thermally diffused (the dopant-containing material is removed through a wet process), or 2) the polycrystalline silicon film is placed in an atmosphere of dopant-containing gas to implant dopant into the polycrystalline silicon film.

When the above-mentioned methods of forming a PN junction are used, there are problems in that the process time is extended due to an increase in the number of processes or it is necessary to use hazardous gases, or it is difficult to control the amount of dopant implanted or the implanting depth of dopant. Accordingly, a first object of the invention is to provide a low-cost polycrystalline silicon solar cell by forming a polycrystalline silicon film having a PN junction simply.

In the invention, a polycrystalline silicon film having a PN junction is formed by poly-crystallizing an amorphous silicon film with plasma, the amorphous silicon film being formed using a dopant-containing silicon ingot through sputtering, and then forming a PN junction therein. Accordingly, it is possible to provide lower-cost polycrystalline silicon solar cell. Preferably, it is possible to provide a low-cost polycrystalline silicon solar cell by feeding a dopant-containing silicon ingot with high material efficiency.

Solution to Problem

A first aspect of the invention relates to a method of manufacturing a polycrystalline solar cell panel, which is described below.

(1) A method of manufacturing a polycrystalline solar cell panel, including: step A of preparing a P-type or N-type silicon target; step B of forming a P-type or N-type amorphous silicon film on the surface of a substrate using the P-type or N-type silicon target through sputtering; and step C of scanning the P-type or N-type amorphous silicon film with plasma to melt the P-type or N-type amorphous silicon film and then re-crystallizing the melted P-type or N-type amorphous silicon film to form a P-type or N-type polycrystalline silicon film.

(2) The method of manufacturing a polycrystalline solar cell panel according to (1), wherein step A includes: obtaining a P-type silicon target through a step of pulverizing a P-type silicon ingot containing boron and having a purity of 99.999 wt % or more to form P-type silicon powder having a purity of 99.999 wt % or more, a step of exposing the P-type silicon powder to plasma to form P-type molten silicon, and a step of re-crystallizing the P-type molten silicon; or obtaining an N-type silicon target through a step of pulverizing an N-type silicon ingot containing phosphorus or arsenic and having a purity of 99.999 wt % or more to form N-type silicon powder having a purity of 99.999 wt % or more, a step of exposing the N-type silicon powder to plasma to form N-type molten silicon, and a step of re-crystallizing the N-type molten silicon.

(3) The method of manufacturing a polycrystalline solar cell panel according to (2), wherein the step of pulverizing the P-type silicon ingot or the N-type silicon ingot includes a step of forming P-type silicon powder with a particle diameter of 0.1 μm to 100 μm using at least one method selected from high-pressure pure water cutting, jet milling, wet atomization, ultrasonic disintegration, and shock wave disintegration.

(4) The method of manufacturing a polycrystalline solar cell panel according to any one of claims 1) to (3), wherein the substrate contains any one of Al, Ag, Cu, Sn, Zn, In, and Fe.

(5) The method of manufacturing a polycrystalline solar cell panel according to any one of (1) to (4), wherein the plasma is atmospheric-pressure plasma.

(6) The method of manufacturing a polycrystalline solar cell panel according to any one of (1) to (5), wherein the scanning speed is in the range of 100 mm/sec to 2000 mm/sec.

(7) The method of manufacturing a polycrystalline solar cell panel according to any one of (1) to (6), further comprising step D of exposing the P-type polycrystalline silicon film formed in step C to plasma under a gas containing arsenic or phosphorus to form a PN junction or exposing the N-type polycrystalline silicon film formed in step C to plasma under a gas containing boron to form a PN junction.

(8) A polycrystalline solar cell panel formed using the method according to (7).

A second aspect of the invention relates to a method of manufacturing a polycrystalline solar cell panel which is described below.

(9) A method of manufacturing a polycrystalline solar cell panel, including: step α of preparing a P-type silicon target and an N-type silicon target; step β of forming an amorphous laminated film of a P-type amorphous silicon film and an N-type amorphous silicon film on the surface of a substrate using the P-type silicon target and the N-type silicon target through sputtering; and step γ of scanning the laminated film with plasma to melt the laminated film and then re-crystallizing the melted laminated film to form a polycrystalline laminated film of a P-type polycrystalline silicon film and an N-type polycrystalline silicon film.

(10) The method of manufacturing a polycrystalline solar cell panel according to (9), wherein step α includes:

obtaining a P-type silicon target through a step of pulverizing a P-type silicon ingot containing boron and having a purity of 99.999 wt % or more to form P-type silicon powder having a purity of 99.999 wt % or more, a step of exposing the P-type silicon powder to plasma to form P-type molten silicon, and a step of re-crystallizing the P-type molten silicon; and obtaining an N-type silicon target through a step of pulverizing an N-type silicon ingot containing phosphorus or arsenic and having a purity of 99.999 wt % or more to form N-type silicon powder having a purity of 99.999 wt % or more, a step of exposing the N-type silicon powder to plasma to form N-type molten silicon, and a step of re-crystallizing the N-type molten silicon.

(11) The method of manufacturing a polycrystalline solar cell panel according to (10), wherein the step of pulverizing the P-type silicon ingot and the N-type silicon ingot includes a step of forming P-type silicon powder with a particle diameter of 0.1 μm to 100 μm using at least one method selected from high-pressure pure water cutting, jet milling, wet atomization, ultrasonic disintegration, and shock wave disintegration.

(12) The method of manufacturing a polycrystalline solar cell panel according to any one of (9) to (11), wherein the substrate contains any one of Al, Ag, Cu, Sn, Zn, In, and Fe.

(13) The method of manufacturing a polycrystalline solar cell panel according to any one of (9) to (12), wherein the plasma is atmospheric-pressure plasma.

(14) The method of manufacturing a polycrystalline solar cell panel according to any one of (9) to (13), wherein the scanning speed is in the range of 100 mm/sec to 2000 mm/sec.

(15) The method of manufacturing a polycrystalline solar cell panel according to any one of (9) to (14), wherein step γ includes forming a PN junction in the polycrystalline laminated film.

(16) A polycrystalline solar cell panel formed using the method according to (15).

Advantageous Effects of Invention

The invention provides a solar cell panel including a polycrystalline silicon film. The polycrystalline silicon film in the solar cell panel according to the invention is formed by poly-crystallizing an amorphous silicon film with plasma, the amorphous silicon film being formed using an impurity-containing silicon target through sputtering. By using this method, it is possible to form a polycrystalline silicon film having a PN junction simply. Therefore, the invention contributes to a decrease in cost of a polycrystalline solar cell panel.

According to the aspects of the invention, it is possible to manufacture an impurity-containing silicon target with high material efficiency. Therefore, the aspects of the invention further contribute to a decrease in cost of a polycrystalline solar cell panel.

BRIEF DESCRIPTION OF DRAWINGS

FIG. 3 is a diagram illustrating a flow of forming an amorphous silicon film on a substrate through sputtering.

FIG. 4 is a diagram schematically illustrating a magnetron sputtering apparatus.

DESCRIPTION OF EMBODIMENTS

A method of manufacturing a polycrystalline solar cell panel according to the invention includes a step of preparing a dopant-containing silicon target; a step of forming a dopant-containing amorphous silicon film on the surface of a substrate using the silicon target; and a step of irradiating the amorphous silicon film with plasma to form a dopant-containing polycrystalline silicon film.

The method of manufacturing a polycrystalline solar cell panel according to the invention can be broadly classified into 1) a first embodiment (see FIG. 5) in which an amorphous silicon film 2d is poly-crystallized and is then doped with a dopant to form a polycrystalline film having a PN junction and 2) a second embodiment (see FIG. 6) in which an amorphous silicon film 2e is additionally formed on an amorphous silicon film 2d to form an amorphous laminated film, the amorphous laminated film is poly-crystallized to form a poly-crystalline silicon film having a PN junction.

The dopant-containing silicon target is obtained from a dopant-containing silicon ingot. The dopant-containing silicon target may be obtained by slicing a dopant-containing silicon ingot. However, when a silicon ingot is sliced, a large amount of cut waste is generated and thus the material efficiency is not good. Accordingly, the dopant-containing silicon target is preferably obtained by melting and re-crystallizing a pulverized product of the dopant-containing silicon ingot.

A schematic configuration for manufacturing a silicon target from the pulverized product of a dopant-containing silicon ingot is shown in FIG. 1.

Figure 1A:
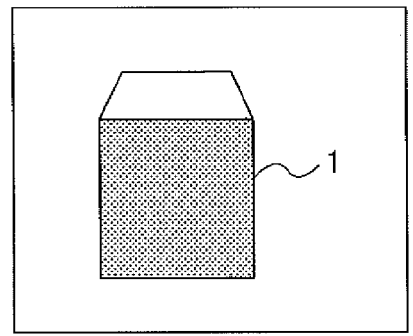
FIG. 1 is a diagram illustrating a flow of obtaining silicon powder from a silicon ingot and obtaining a silicon target.

First, a dopant-containing silicon ingot 1 is prepared (FIG. 1A). The dopant-containing silicon ingot may contain P-type dopant or may contain N-type dopant. Examples of the P-type dopant include boron and examples of the N-type dopant include phosphorus and arsenic. The dopant concentration in the silicon ingot can be appropriately set depending on its application.

The dopant-containing silicon ingot has only to satisfy the criterion of solar grade silicon. The silicon purity in the silicon ingot satisfying the criterion of solar grade silicon is 99.99 wt %, preferably 99.999 wt %, and more preferably 99.9999 wt %.

Figure 1B:
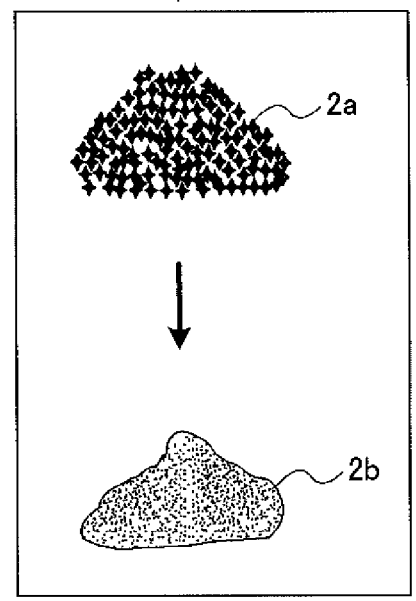

The dopant-containing silicon ingot 1 is pulverized to obtain silicon powder 2b (FIG. 1B). The pulverization to the silicon powder is preferably performed without lowering the silicon purity of the dopant-containing silicon ingot. Accordingly, the pulverization of the dopant-containing silicon ingot 1 is preferably performed through plural steps including the following two steps. By performing the pulverization by combination of plural steps, it is possible to disintegrate within a shorter time, compared with a case where the ingot 1 disintegrates in a desired particle diameter through a single step.

In a first step of pulverization, the dopant-containing silicon ingot 1 is made into crude silicon powder 2a through ultrahigh-pressure water cutting. The particle diameter of the crude silicon powder 2a is less than or equal to about 3 mm and preferably less than or equal to 1 mm. The ultrahigh-pressure water cutting is a technique of cutting a material using impact energy of ultrahigh-pressure water. The ultrahigh-pressure water may be water having a water pressure of about 300 MPa. The ultrahigh-pressure water cutting can be performed, for example, using an ultrahigh-pressure water cutting machine made by Sugino Machine Limited. Water used at this time is preferably pure water with resistivity of 18 MΩ·cm which is in the level capable of being used in semiconductor processes.

In a second step of pulverization, the resultant crude silicon powder 2a is made into silicon powder 2b through a wet atomization method such as a star burst system made by Sugino Machine Limited, jet milling, ultrasonic disintegration, or shock wave disintegration. The particle diameter of the silicon powder 2b is in the range of 0.1 μm to 100 μm and preferably in the range of 0.3 μm to 70 μm. The wet atomization is a wet atomization system in which pressure energy of an ultrahigh pressure of 245 MPa is applied to a liquid in a flow channel in which a pulverization product is dispersed, the flow channel is branched into two flow channels, and the pulverization products are made to collide with each other at a part in which two branched flow channels are merged to perform the atomization. Since the wet atomization is atomization means not using pulverization medium, like jet milling, ultrasonic disintegration, or shock wave disintegration, it is possible to suppress mixture of impurities.

The particle diameter of the silicon powder 2b is set in consideration of the time of melting the silicon powder 2b in addition to the capability of the pulverization equipment and the production time in mass production. When the particle diameter of the silicon powder 2b is less than or equal to 100 it is possible to melt the silicon powder 2b at a relatively low temperature. Since the typical melting temperature of silicon is 1410° C., a large-scale furnace is necessary for melting silicon. However, when the particle diameter of the silicon powder is less than or equal to 100 μm, the melting temperature is lowered.

Impurities degrading the characteristics of a solar cell, such as Al, Fe, Cr, Ca, and K, are not mixed into the silicon powder 2b in the pulverizing step (FIG. 1B). That is, the silicon ingot 1 can be atomized with the purity thereof maintained. Accordingly, when the purity of the silicon ingot 1 is more than or equal to 99.99% (preferably more than or equal to 99.9999%), the purity of the obtained silicon powder can be made to be more than or equal to 99.99% (preferably more than or equal to 99.9999%).

On the other hand, when the silicon ingot 1 is pulverized by the use of a pulverizer or a roller, impurities are mixed into the pulverized product and thus the silicon ingot 1 cannot be atomized with the purity thereof maintained.

Figure 1C:
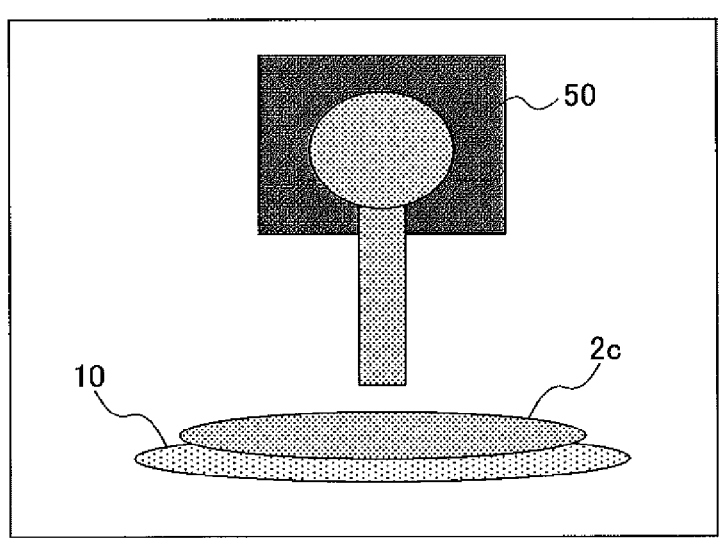

The resultant silicon powder 2b is placed on a substrate 10 (FIG. 1C). The silicon power 2b is not placed on the substrate 10 but may be received in a vessel. The material of the substrate 10 is not particularly limited, and examples thereof include copper (Cu), molybdenum (Mo), titanium (Ti), and stainless steel (SUS).

When placing the silicon powder 2b on the substrate 10, it is preferable that the dry silicon powder be applied with a squeeze. The amount of silicon powder placed on the substrate 10 is preferably about 1.5 g/cm$^2$. The amount of silicon powder placed on the substrate 10 is preferably set to an amount with which the thickness of the resultant silicon target 2c is in the range of 5 to 15 mm.

The silicon powder 2b placed on the substrate 10 is irradiated with plasma, the silicon powder 2b is melted, is then cooled and poly-crystallized to obtain a silicon target 2c (FIG. 1C). The plasma may be vacuum plasma but is preferably atmospheric-pressure plasma from the viewpoint of convenient processing and simple configuration of the apparatus.

Figure 2:
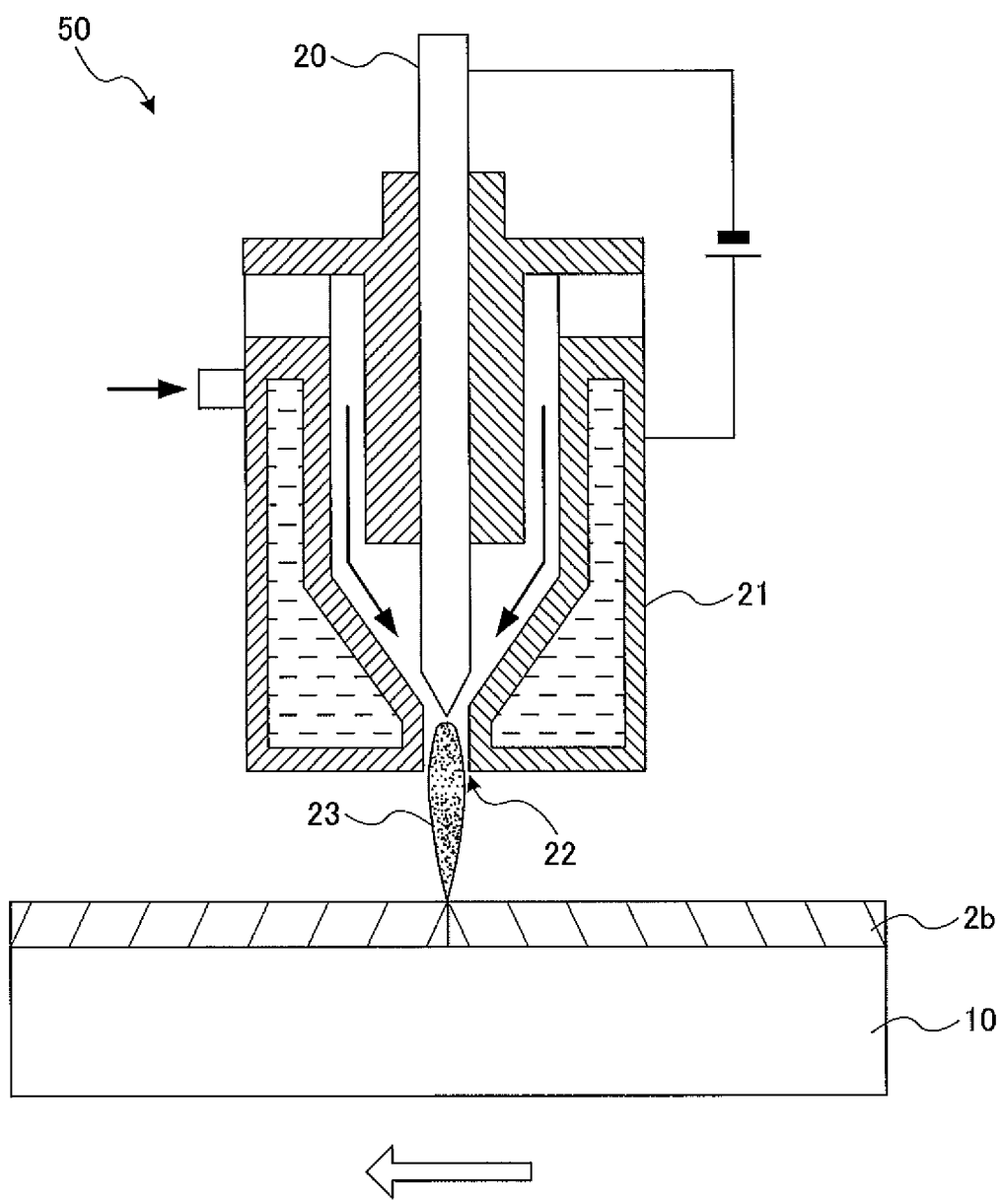
FIG. 2 is a diagram illustrating a state where silicon powder is irradiated with plasma.

The schematic configuration of an atmospheric-pressure plasma apparatus used herein is shown in FIG. 2. As shown in FIG. 2, the atmospheric-pressure plasma apparatus 50 includes a negative electrode 20 and a positive electrode 21. The positive electrode 21 is provided with a plasma jetting port 22. When a DC voltage is applied across the negative electrode 20 and the positive electrode 21, arc discharge is generated and thus plasma 23 is jetted from the plasma jetting port 22 by causing inert gas (such as nitrogen gas) to flow therein. Such an atmospheric-pressure plasma apparatus is described, for example, in JP-A-2008-53632.

The substrate 10 having the silicon powder 2b placed thereon is mounted on an XYZ-axis movable stage (not shown) of the atmospheric-pressure plasma apparatus 50 and the surface of the substrate 10 is scanned with the atmospheric-pressure plasma from an end to the other end to perform heat treatment thereon. The temperature of the atmospheric-pressure plasma is higher than or equal to 10000° C., but the temperature of the tip of the plasma jetting port 22 is preferably adjusted to about 2000° C. The plasma jetting port 22 is disposed separated about 5 mm from the silicon powder 2b on the substrate 10. The input power is set to 20 kW and the plasma 23 is extruded with inert gas and is jetted to the substrate 10. The plasma 23 from the plasma jetting port 22 is applied to an area with a diameter of 40 mm on the surface of the substrate 10. The silicon powder 2b in the area to which the plasma 23 is applied is melted.

The temperature of the atmospheric-pressure plasma 23 on the surface of the substrate 10 can be arbitrarily controlled depending on the power of an atmospheric-pressure power source or the gap between the jetting port 22 and the substrate 10. By appropriately controlling the temperature of the atmospheric-pressure plasma 23 on the surface of the substrate 10, the melting condition of the silicon powder 2b is adjusted.

After the silicon powder 2b is melted, inert gas (such as nitrogen gas) is additionally applied thereto to cool and polycrystallize the melted silicon powder. Accordingly, a silicon target 2c is formed on the substrate 10. At this time, when the melted silicon powder 2b is rapidly cooled, polycrystalline silicon having a small crystal grain size is obtained.

A small amount of hydrogen gas may be mixed into the inert gas used to extrude the plasma. By mixing the small amount of hydrogen gas, it is possible to remove an oxide film formed on the surface of the silicon particles 2b and to obtain a silicon target 2c having a small defect.

The scanning speed is preferably set to be in the range of 100 mm/sec to 2000 min/sec and, for example, is set to about 1000 mm/sec. When the scanning speed is lower than or equal to 100 mm/sec, the substrate 10 serving as an underlying layer is melted and may adversely influence on the resultant silicon target 2c. When the scanning speed is higher than or equal to 2000 mm/sec, only the top part of the silicon particles 2b are melted. When the scanning speed is higher than or equal to 2000 mm/sec, the apparatus or system is complicated.

The silicon target 2c formed on the substrate 10 is separated from the substrate 10 and is used as a silicon target for forming a film through sputtering. The silicon target 2c contains dopant similarly to the silicon ingot 1 as a raw material. That is, the silicon target 2c is doped with P-type or N-type dopant. The dopant concentration in the silicon target 2c can be appropriately set depending on its application.

The thickness of the resultant silicon target is preferably in the range of 5 to 15 mm. This is because it can be suitably used as a target for forming a film through sputtering.

2. Polycrystalline Solar Cell Panel

The polycrystalline solar cell panel according to the invention is characterized in that an amorphous silicon film is formed on a substrate using a dopant-containing silicon target through sputtering, the formed amorphous silicon film is irradiated with plasma to heat and melt the amorphous silicon film, and the resultant is additionally cooled and re-crystallized to form a polycrystalline silicon film. The flow thereof is shown in FIG. 3 and FIGS. 5 to 7.

First, a substrate 3 is prepared (FIG. 3A). The substrate 3 becomes an electrode of a solar cell. Specifically, the substrate 3 is not particularly limited, as long as it is a metal substrate or a roll of Al, Ag, Cu, Fe, and the like used as a rear electrode of a solar cell. The substrate 3 may be a high-conductivity transparent substrate and is, for example, an inorganic substrate containing Sn, Zn, In, or the like. When the high-conductivity transparent substrate is used, plural solar cells can be stacked.

An amorphous silicon film 2d is formed on the surface of the substrate 3 using the dopant-containing silicon target (FIG. 3B). The sputtering film formed using the dopant-containing silicon target becomes an amorphous silicon film 2d containing dopant, similarly to the target. That is, the amorphous silicon film 2d formed using a P-type silicon target through sputtering contains P-type dopant, and the amorphous silicon film 2d using an N-type silicon target through sputtering contains N-type dopant.

The dopant-containing silicon target used herein can employ the silicon target obtained from the above-mentioned pulverized product of the silicon ingot.

The sputtering can be carried out using a typical sputtering apparatus, for example, a magnetron sputtering apparatus. FIG. 4 shows the schematic configuration of a magnetron sputtering apparatus 100. The magnetron sputtering apparatus 100 includes a vacuum chamber 51, a magnetron electrode including a silicon target 2c, a water-cooling jacket 61, and a magnetic circuit 60, and a substrate 3.

The vacuum chamber 51 is provided with a gas introduction device 55, exhaust equipment 56, an exhaust port 57, and a valve 58. The exhaust equipment 56 can negatively pressurize the inside of the vacuum chamber 51. The gas introduction device 55 can introduce sputtering gas into the vacuum chamber 51. The sputtering gas is generally inert gas such as Ar gas.

The magnetron electrode includes a silicon target 2c, a high-voltage power source 62 connected to the silicon target 2c, and a magnetic circuit 60 disposed on the rear side of the silicon target 2c (on the opposite surface of the surface facing the substrate 3). A water-cooling jacket 61 is disposed between the magnetic circuit 60 and the silicon target 2c. The silicon target 2c is attached to a packing plate 63. An earth shield 59 is disposed around the magnetron electrode.

The substrate 3 on which a sputtering film is formed is supported by a substrate support tool 54 and is disposed to face the silicon target 2c.

The dopant-containing silicon target 2c is disposed in the magnetron sputtering apparatus 100 and the substrate 3 is supported by the substrate support tool 54. The specific sputtering conditions are not particularly limited, but the internal pressure of the vacuum chamber 51 can be set to 0.5 Pa, the power of a DC power source can be set to 1 kW, and the electrode gap (the gap between the silicon target 2c and the substrate 3) can be set to about 100 mm.

The thickness t (see FIG. 3B) of the amorphous silicon film 2d formed on the substrate 3 can be changed depending on its purpose in consideration of the textured structure or the like. The general thickness t of the amorphous silicon film 2d is in the range of 0.1 to 0.5 μm. The amorphous silicon film should be uniformly formed on the surface of the substrate 3 through sputtering.

The amorphous silicon film 2d is changed to a polycrystalline silicon film having a PN junction, which is used as a silicon substrate of a solar cell panel. The manufacturing flow thereof can be broadly classified into the following two embodiments.

First Embodiment) The amorphous silicon film 2d is polycrystallized and then the surface layer thereof is doped with dopant to form a polycrystalline silicon film having a PN junction (FIG. 5).

Second Embodiment) An amorphous silicon film 2e is additionally formed on the amorphous silicon film 2d to form an amorphous laminated film, and then the amorphous laminated film is poly-crystallized to form a polycrystalline silicon film having a PN junction (FIG. 6).

First Embodiment

The first embodiment will be described below with reference to FIG. 5. The amorphous silicon film 2d (FIG. 5A) formed on the substrate 3 is irradiated with plasma, and the amorphous silicon film 2d is melted, additionally cooled, and poly-crystallized to form a polycrystalline silicon film 4 (FIG. 5B). The irradiated plasma is preferably atmospheric-pressure plasma. The irradiation of atmospheric-pressure plasma can be performed using the atmospheric-pressure plasma apparatus 50 shown in FIG. 2.

The substrate 3 having the amorphous silicon film 2d formed thereon is mounted on an XYZ-axis movable stage of the atmospheric-pressure plasma apparatus 50 and the surface of the substrate 3 is scanned with the atmospheric-pressure plasma source from an end to the other end to perform heat treatment. The temperature of the atmospheric-pressure plasma is generally higher than or equal to 10000° C., but the temperature of the tip of the plasma jetting port 22 is adjusted to about 2000° C. The plasma jetting port 22 is disposed separated about 5 mm from the amorphous silicon film 2d on the substrate 3. The input power is set to 20 kW and the plasma 23 is extruded with nitrogen gas and is jetted to the surface of the substrate 3. The plasma 23 from the plasma jetting port 22 is applied to an area with a diameter of 40 mm on the surface of the substrate 3. The amorphous silicon 2d in the area to which the plasma 23 is applied is melted.

The temperature of the atmospheric-pressure plasma 23 on the surface of the substrate can be arbitrarily controlled depending on the power of an atmospheric-pressure power source or the gap between the jetting port 22 and the substrate 3. By appropriately controlling the temperature of the atmospheric-pressure plasma 23 on the surface of the substrate 3, the melting condition of the amorphous silicon 2d is adjusted.

After the amorphous silicon 2d is melted with the application of plasma, inert gas (such as nitrogen gas) is additionally applied thereto to cool and poly-crystallize the melted silicon powder. Accordingly, a polycrystalline silicon film 4 is formed on the surface of the substrate 3. At this time, when the melted amorphous silicon 2d is rapidly cooled, polycrystalline silicon having a small crystal grain size is obtained. Accordingly, it is preferable that the melted amorphous silicon be cooled as rapidly as possible so as to obtain a crystal grain size of 0.05 μm or less.

A small amount of hydrogen gas may be mixed into the inert gas used to extrude the plasma. By mixing the small amount of hydrogen gas, it is possible to remove an oxide film formed on the surface of the amorphous silicon 2d and to obtain a polycrystalline silicon film 4 having a small crystal defect.

The scanning speed for the irradiation with plasma is preferably set to be in the range of 100 mm/sec to 2000 mm/sec and, for example, is set to about 1000 mm/sec. When the scanning speed is lower than or equal to 100 mm/sec, the substrate 3 serving as an underlying layer is melted and may adversely influence on the resultant polycrystalline silicon film 4. When the scanning speed is higher than or equal to 2000 mm/sec, only the top part of the amorphous silicon 2d is melted. When the scanning speed is higher than or equal to 2000 mm/sec, the apparatus or system is complicated.

In this way, by employing the amorphous silicon film 2d as the silicon film formed on the substrate 3, it is possible to melt the silicon film with the atmospheric-pressure plasma. By using the atmospheric-pressure plasma, it is possible to efficiently melt and re-crystallize the amorphous silicon 2d disposed on a large-area substrate 3. On the other hand, it is generally difficult to melt bulk silicon with the atmospheric-pressure plasma.

Figure 5A:
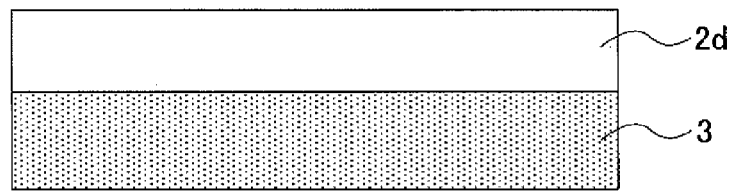
FIG. 5 is a diagram illustrating a flow of manufacturing a solar cell panel.
Figure 5B:
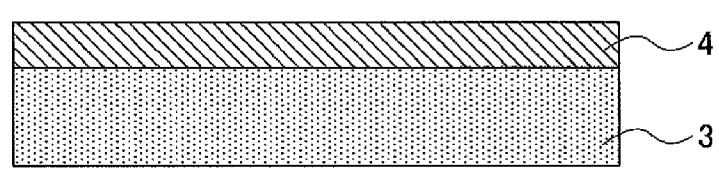
Figure 5C:
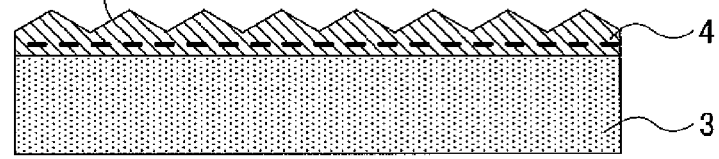

The surface of the polycrystalline silicon film 4 is processed in an uneven shape to form a textured structure 5 (FIG. 5C). In general, the incident surface of a silicon film of a solar cell is processed in a textured structure 5 to suppress reflection from the incident surface. The surface processing means of the polycrystalline silicon film 4 is not particularly limited, but the surface of the polycrystalline silicon film may be processed with an acid or alkali (such as KOH) solution or may be processed with gas plasma using chlorine trifluoride gas ($ClF_3$) or sulfur hexafluoride ($SF_6$). The specific textured structure 5 is not particularly limited but may employ known structures.

Figure 5D:
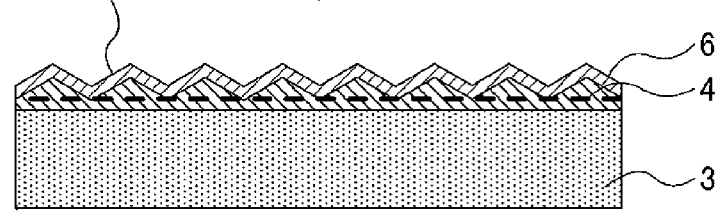

Dopant is implanted into the surface layer 6 of the polycrystalline silicon film 4 having the textured structure 5 (FIG. 5D). Specifically, N-type dopant is implanted into the surface layer 6 of the polycrystalline silicon film 4 when the polycrystalline silicon film 4 contains P-type dopant, and P-type dopant is implanted into the surface layer 6 of the polycrystalline silicon film 4 when the polycrystalline silicon film 4 contains N-type dopant.

The implantation of dopant can be preferably performed using plasma. When implanting phosphorus or arsenic which is N-type dopant, the polycrystalline silicon film 4 has only to be irradiated with the plasma in the presence of phosphorus-containing gas (such as $PH_3$) or arsenic-containing gas (such as $AsH_3$). When implanting boron which is P-type dopant, the polycrystalline silicon film 4 has only to be irradiated with the plasma in the presence of boron-containing gas (such as $BH_3$).

After the implantation of dopant, the dopant is activated by irradiating the surface layer 6 of the polycrystalline silicon film 4 with a lamp. As a result, the polycrystalline silicon film 4 having a PN junction is formed.

Figure 5E:
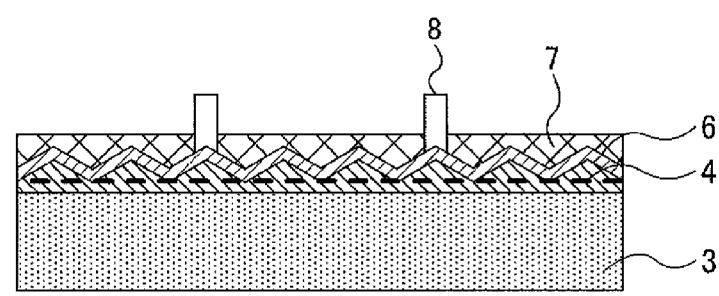

An insulating film 7 is stacked on the polycrystalline silicon film 4 (FIG. 5E). The insulating film 7 may be a silicon nitride film or the like. By stacking the insulating film 7, it is possible to suppress reflection of incident light and to prevent degradation of electrical characteristics. A part of the insulating film 7 is etched and an electrode 8 is formed in the etched part of a line shape (FIG. 5E). The material of the electrode 8 is, for example, silver.

Second Embodiment

The second embodiment will be described below with reference to FIG. 6. Another amorphous silicon film 2e is stacked on the amorphous silicon film 2d (FIG. 6A) formed on the substrate 3. The amorphous silicon film 2e contains dopant. Specifically, the amorphous silicon film 2e contains N-type dopant when the amorphous silicon film 2d contains P-type dopant, and the amorphous silicon film 2e contains P-type dopant when the amorphous silicon film 2d contains N-type dopant.

Similarly to the amorphous silicon film 2d, the amorphous silicon film 2e is preferably formed using the dopant-containing silicon target through sputtering. The amorphous silicon film 2e containing P-type dopant is formed when the P-type silicon target is used, and the amorphous silicon film 2e containing N-type dopant is formed when the N-type silicon target is used. The dopant-containing silicon target used to form the amorphous silicon film 2e is preferably obtained from the pulverized product of the silicon ingot as described above.

The thickness of the amorphous silicon film 2e is preferably in the range of 0.5 to 50 μm. The thickness of the amorphous silicon film 2e preferably occupies 2% to 10% of the thickness of the amorphous silicon film 2d. By optimizing the thicknesses of both, it is possible to enhance the power generation efficiency.

Figure 6A:
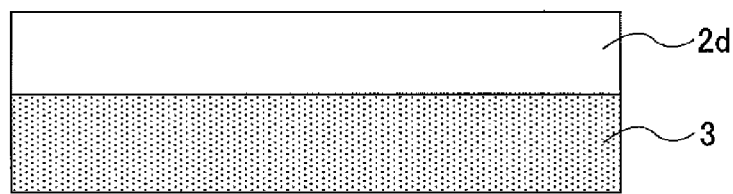
FIG. 6 is a diagram illustrating a flow of manufacturing a solar cell panel.
Figure 6B:
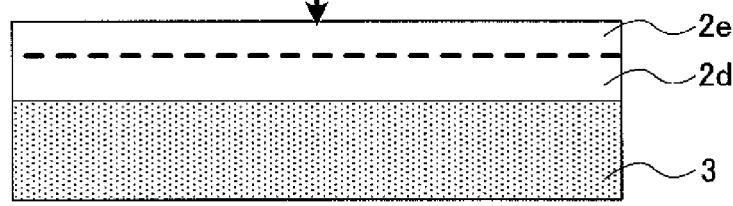
Figure 6C:
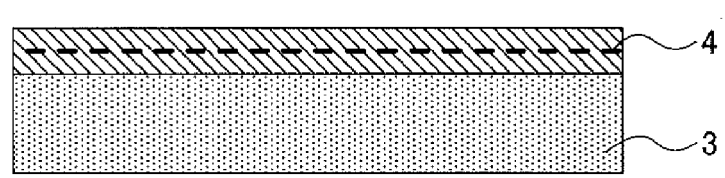

The laminated film of the amorphous silicon film 2d and the amorphous silicon film 2e is irradiated with plasma to melt the laminated film, the melted laminated film is further cooled and poly-crystallize to form a polycrystalline silicon film 4 (FIG. 6C). The plasma to be irradiated is preferably atmospheric-pressure plasma.

The apparatus or technique of applying the atmospheric-pressure plasma is the same as obtaining the polycrystalline silicon film 4 in FIG. 5B.

Figure 6D:
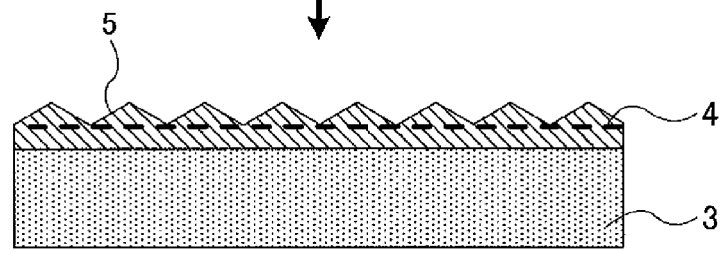

The surface of the polycrystalline silicon film 4 is processed in an uneven shape to form a textured structure 5 (FIG. 6D). The formation of the textured structure 5 is performed in the same way as forming the textured structure 5 in FIG. 5C.

Figure 6E:
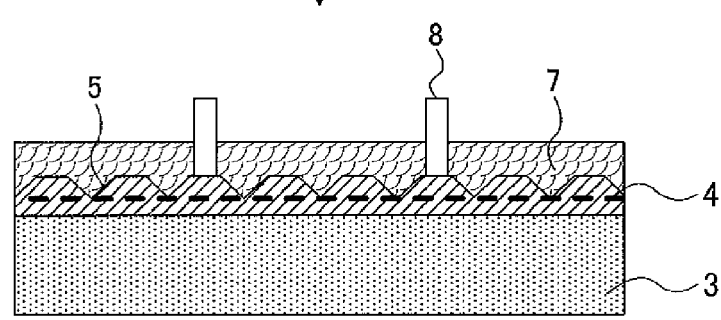

An insulating film 7 is formed on the polycrystalline silicon film 4 and an electrode 8 is formed therein (FIG. 6E). The insulating film 7 and the electrode 8 are the same as shown in FIG. 5E.

Other Embodiments

In the first embodiment and the second embodiment, the amorphous silicon film 2d is formed on the substrate 3. In this embodiment (another embodiment), silicon powder 2b containing dopant is disposed on the substrate 3, a dopant-containing amorphous silicon film 2d is formed on the silicon powder 2b, and the polycrystalline silicon film 4 having a PN junction is obtained by irradiating the resultant with plasma and poly-crystallizing both of the silicon powder 2b and the amorphous silicon film 2d (see FIG. 7).

Figure 7A:
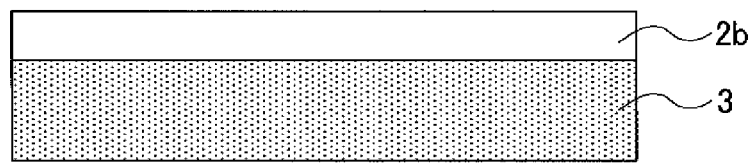
FIG. 7 is a diagram illustrating a flow of manufacturing a solar cell panel.

This embodiment (another embodiment) will be described with reference to FIG. 7. First, the silicon powder 2b is applied onto the substrate 3 (FIG. 7A). The substrate 3 is the same as the substrate 3 shown in FIG. 3A. The silicon powder 2b is obtained by pulverizing a dopant-containing silicon ingot (see FIG. 1B) and contains P-type dopant or N-type dopant.

The silicon powder 2b may be formed a) by applying dry silicon powder with a squeeze or b) by applying ink obtained by dispersing the silicon powder 2b in a solvent through the use of a spin coater, a die coater, an ink jet, a dispenser, or the like. The ink is obtained by dispersing silicon powder in alcohol or the like. The ink containing the silicon powder can be obtained, for example, with reference to JP-A-2004-318165.

The amount of the silicon powder 2b applied to the substrate 3 needs to be adjusted accurately and it is specifically preferable that the amount of silicon powder be set to the range of about 2 to 112 g/cm$^2$. Here, a surface of the applied film containing the silicon powder 2b on the substrate 3 may have unevenness more or less. As described later, since the applied silicon powder 2b is melted with plasma, the coated film is smoothed.

Figure 7B:
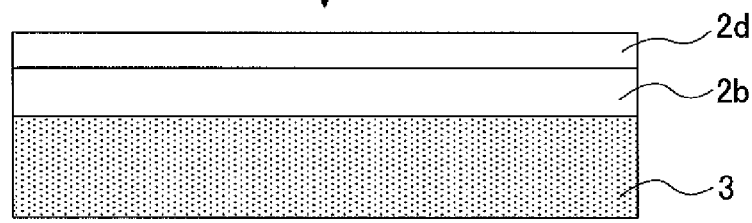

The amorphous silicon film 2d is formed and stacked on the applied silicon powder 2b (FIG. 7B). The amorphous silicon film 2d contains dopant. The amorphous silicon film 2d contains N-type dopant when the silicon powder 2b contains P-type dopant, and the amorphous silicon film 2d contains P-type dopant when the silicon powder 2b contains N-type dopant.

The amorphous silicon film 2d is formed using a sputtering apparatus or a CVD apparatus, but is preferably formed using the above-mentioned dopant-containing silicon target 2c. By forming the amorphous silicon film 2d, a part (the side of the amorphous silicon film 2d) of the silicon powder 2b may become amorphous.

The thickness of the amorphous silicon film 2d stacked on the silicon powder 2b is not particularly limited, but can be set to the range of 0.1 to 0.5 μm.

Figure 7C:
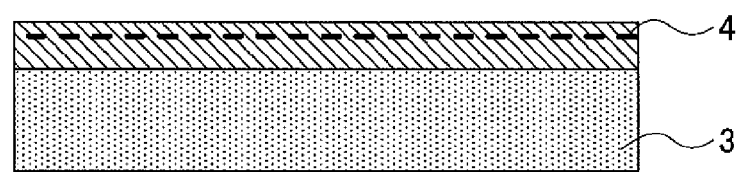

The silicon powder 2b and the amorphous silicon film 2d on the substrate 3 are melted with the atmospheric-pressure plasma, and are further cooled to form a polycrystalline silicon film 4 (see FIG. 7C). The irradiation with the atmospheric-pressure plasma can be performed using the apparatus shown in FIG. 2. The technique is the same as forming the laminated film of the amorphous silicon film 2d and the amorphous silicon film 2e into a polycrystalline silicon film in the second embodiment (see FIG. 6C).

A PN junction is formed in the polycrystalline silicon film 4 and the thickness of the polycrystalline silicon film 4 is preferably set to the range of 0.5 to 50 μm.

Figure 7D:
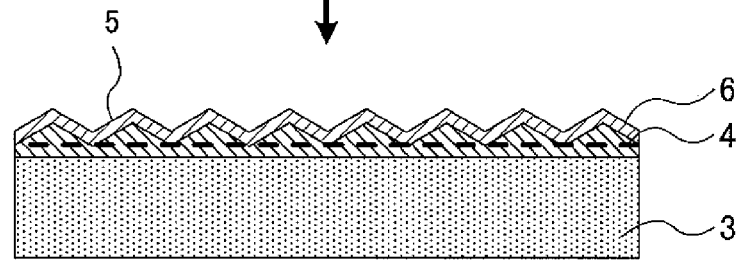

The surface of the polycrystalline silicon film 4 is processed in an uneven shape to form a textured structure 5 (FIG. 7D). The formation of the textured structure 5 can be performed in the same way as forming the textured structure 5 in FIG. 5C. The surface layer 6 of the polycrystalline silicon film 4 is activated.

Figure 7E:
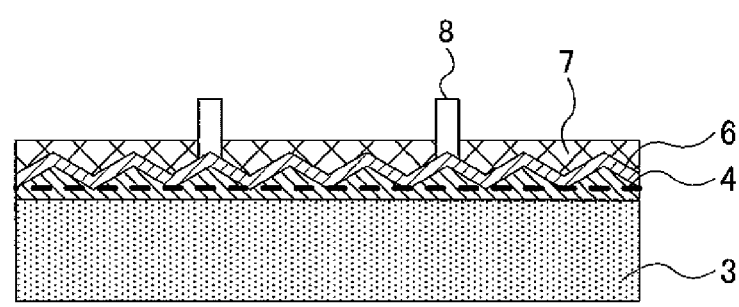
Figure 8:
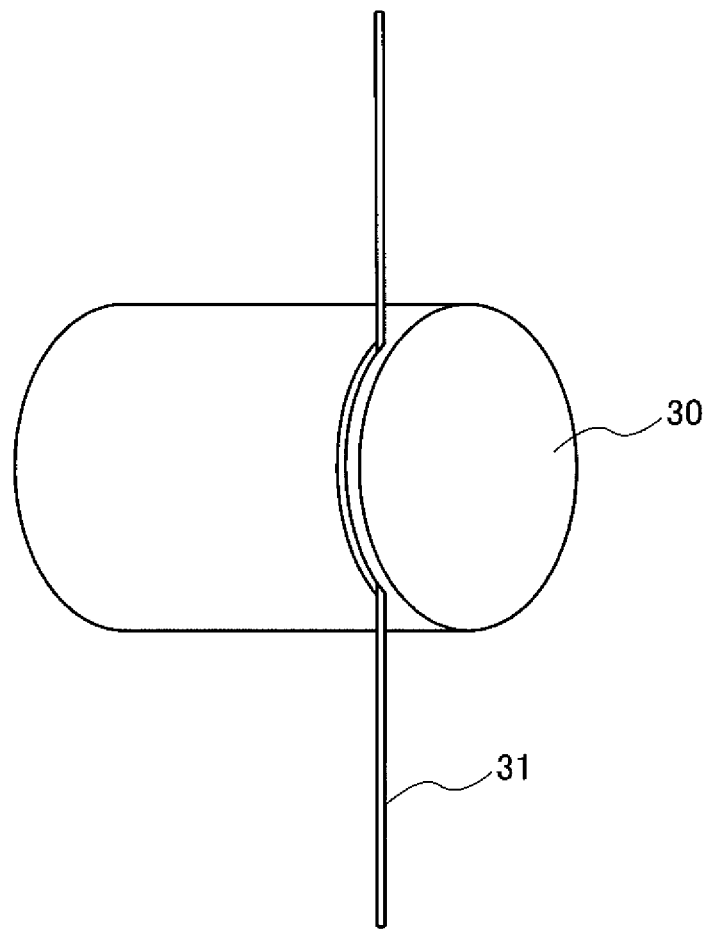
FIG. 8 is a diagram illustrating a state where a silicon ingot is sliced.
Figure 9:
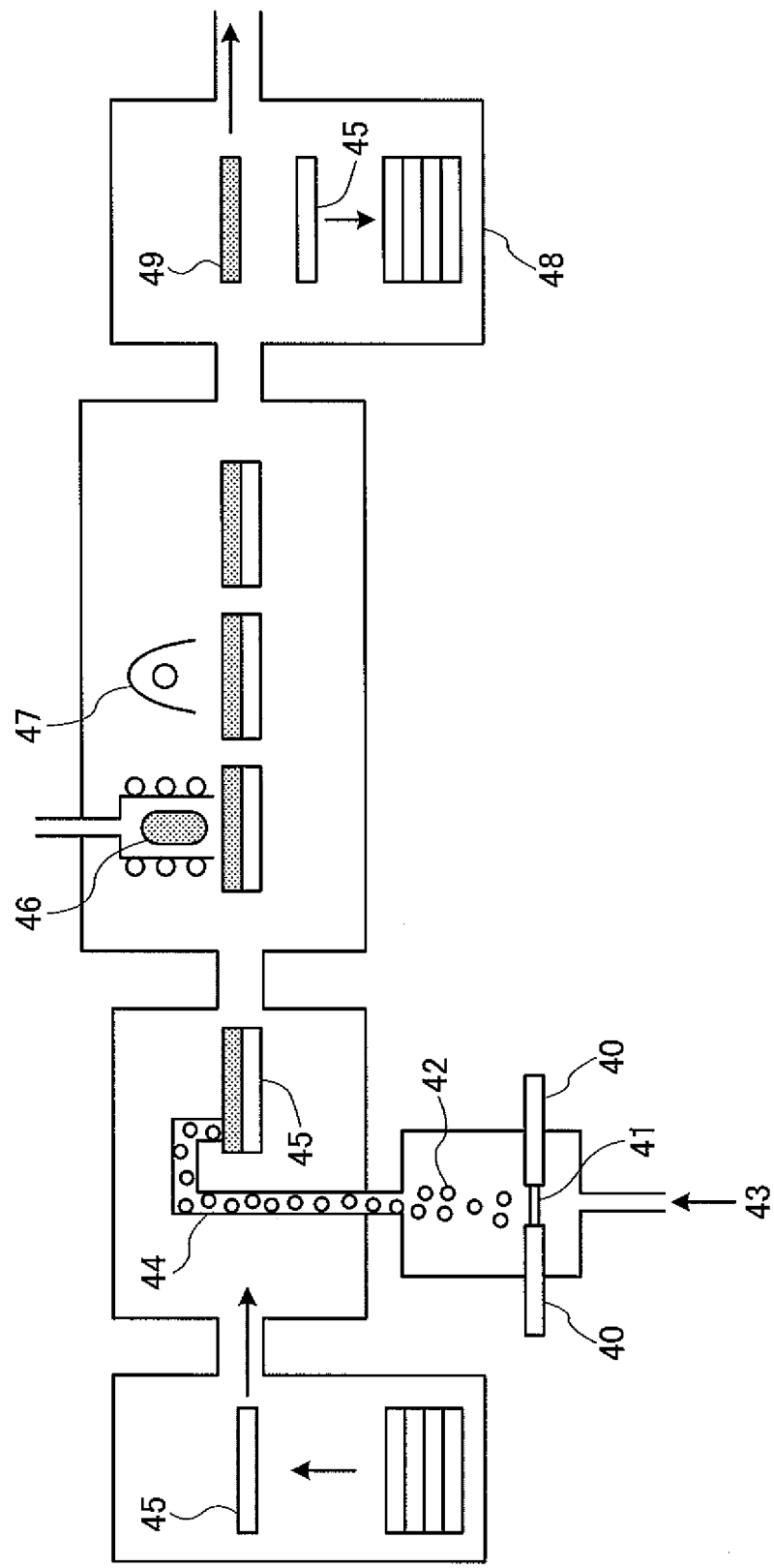
FIG. 9 is a diagram schematically illustrating a polycrystalline silicon film manufacturing apparatus according to the related art.

An insulating film 7 is formed on the polycrystalline silicon film 4 and an electrode 8 is formed therein (FIG. 7E). The insulating film 7 and the electrode 8 are the same as shown in FIG. 5E (FIG. 7E).

Experimental Example 1

A boron-containing amorphous silicon film 2d was formed on a substrate (material: aluminum, size: 370 mm (X axis)× 470 mm (Y axis)) using a boron-containing silicon target through sputtering (FIG. 5A). The thickness of the amorphous silicon film 2d was 50 μm.

The substrate was irradiated with plasma from an end of the substrate to the other end while scanning the substrate with the atmospheric-pressure plasma apparatus shown in FIG. 2 in the X axis direction, the amorphous silicon 2d was melted and re-crystallized, and thus the polycrystalline silicon film 4 was obtained (FIG. 5B). The area irradiated with the plasma has a diameter of 40 mm. Nitrogen gas containing a small amount of hydrogen gas was used as the inert gas used to extrude the plasma. When the scanning from an end to the other end is finished, the substrate was shifted by 40 mm in the Y axis direction and was irradiated with the plasma while scanning the substrate in the X axis direction. By repeating this process, the overall amorphous silicon 2d disposed on the substrate was re-crystallized in a band shape to form a substantially uniform polycrystalline silicon film. The thickness of the polycrystalline silicon film 4 was about 50 μm.

Then, the surface of the polycrystalline silicon film 4 was processed (textured) in an uneven shape (FIG. 5C). The surface of the polycrystalline silicon film 4 may be processed through wet etching using an acid or alkali (such as KOH) solution or may be processed through gas plasma etching using chlorine trifluoride gas (ClF$_3$) or sulfur hexafluoride (SF$_6$).

The surface of the polycrystalline silicon film 4 was doped with phosphorus using plasma (FIG. 5D). The doping was performed by introducing PH$_3$ gas (diluted with 0.5% He) into a 20 SCCM chamber under the pressure condition of 10 Pa and performing the doping process with the power of 200 W using high-frequency discharge of 13.56 MHz for 30 seconds. The doped polycrystalline silicon film 4 was irradiated with a lamp to active the impurities.

For the purpose of preventing reflection and preventing degradation of electrical characteristics of a crystal edge, an insulating film 7 (a silicon nitride film) was formed through sputtering (FIG. 5E). A part of the insulating film 7 was etched and a silver electrode 8 of a line shape was formed in the etched part.

In this way, a solar cell with an open voltage of 0.6 V (in terms of 10 cm$^2$) was obtained. This is data equivalent to that of commercially-available crystalline solar cells.

In Experimental Example 1, the amorphous silicon film 2d containing boron was formed, poly-crystallized, and dope with phosphorus to form a PN junction. On the other hand, when an amorphous silicon film containing arsenic or phosphorus may be formed, poly-crystallized, and dope with P-type dopant such as boron to form a PN junction, the same advantages can be achieved.

Experimental Example 2

A boron-containing amorphous silicon film 2d was formed on a substrate (material: aluminum, size: 370 mm (X axis)× 470 mm (Y axis)) using a boron-containing silicon target through sputtering (FIG. 6A). The thickness of the amorphous silicon film 2d was 50 μm.

An arsenic-containing amorphous silicon film 2e was formed on the boron-containing amorphous silicon 2d through sputtering to form a laminated film (FIG. 6B). The thickness of the arsenic-containing amorphous silicon film 2e was 2 μm.

The substrate was irradiated with plasma from an end to the other end while scanning the substrate with the atmospheric-pressure plasma apparatus shown in FIG. 2 in the X axis direction, the amorphous silicon films 2d and 2e were melted and re-crystallized, and thus the polycrystalline silicon film 4 was obtained (FIG. 6C). The area irradiated with the plasma has a diameter of 40 mm. Nitrogen gas containing a small amount of hydrogen gas was used as the inert gas used to extrude the plasma. When the scanning from an end to the other end is finished, the substrate was shifted by 40 mm in the Y axis direction and was irradiated with the plasma while scanning the substrate in the X axis direction. By repeating this process, the overall amorphous silicon films 2d and 2e disposed on the substrate were re-crystallized in a band shape to form a substantially uniform polycrystalline silicon film.

Then, the surface of the polycrystalline silicon film 4 was processed (textured) in an uneven shape (FIG. 6D).

For the purpose of preventing reflection and preventing degradation of electrical characteristics of a crystal edge, an insulating film 7 (a silicon nitride film) was formed through sputtering (FIG. 6E). A part of the insulating film 7 was etched and a silver electrode 8 of a line shape was formed in the etched part (FIG. 6E).

In this way, a solar cell with an open voltage of 0.6 V (in terms of 10 cm$^2$) was obtained. This is data equivalent to that of commercially-available crystalline solar cells.

In Experimental Example 2, the boron-containing amorphous silicon film 2d was formed, then the arsenic-containing amorphous silicon film 2e was stacked thereon, and the PN junction was formed using gas plasma. On the other hand, when the arsenic-containing amorphous silicon film 2d may be formed, the boron-containing amorphous silicon film 2e may be stacked thereon, and a PN junction may be formed using gas plasma, the same advantages can be achieved.

Experimental Example 3

Silicon powder 2b with a particle diameter of about 1 μm was applied to a substrate (material: aluminum, size: 370 mm (X axis)×470 mm (Y axis)) (FIG. 7A). Since the silicon powder 2b was obtained by pulverizing a boron-containing silicon ingot, the silicon powder was doped with P-type dopant. The application of the silicon powder 2b was performed by the use of a squeeze and the thickness of the applied silicon powder film was about 30 μm.

Thereafter, a silicon amorphous film 2d was formed on the silicon powder 2b using a phosphorus-containing silicon target (FIG. 7B). The thickness of the silicon amorphous film 2d was 2 μm.

The substrate was irradiated with plasma from an end to the other end while scanning the substrate with the atmospheric-pressure plasma apparatus shown in FIG. 2 in the X axis direction, the silicon powder and the amorphous silicon film were melted and re-crystallized, and thus the polycrystalline silicon film 4 was obtained (FIG. 7C). The area irradiated with the plasma has a diameter of 40 mm. Nitrogen gas containing a small amount of hydrogen gas was used as the inert gas used to extrude the plasma. When the scanning from an end to the other end is finished, the substrate was shifted by 40 mm in the Y axis direction and was irradiated with the plasma while scanning the substrate in the X axis direction. By repeating this process, all the silicon powder and the amorphous silicon film disposed on the substrate was re-crystallized in a band shape to form a substantially uniform polycrystalline silicon film. The thickness of the polycrystalline silicon film was about 15 μm.

Then, the surface layer 6 of the polycrystalline silicon film 4 was processed (textured) in an uneven shape (FIG. 7D). The surface of the polycrystalline silicon film 4 may be processed through wet etching using an acid or alkali (such as KOH) solution or may be processed through gas plasma etching using chlorine trifluoride gas ($ClF_3$) or sulfur hexafluoride ($SF_6$).

For the purpose of preventing reflection and preventing degradation of electrical characteristics of a crystal edge, an insulating film 7 (a silicon nitride film) was formed through sputtering (FIG. 7E). A part of the insulating film 7 was etched and a silver electrode 8 of a line shape was formed in the etched part (FIG. 7E).

In this way, a solar cell with an open voltage of 0.6 V (in terms of 10 cm$^2$) was obtained. This is data equivalent to that of commercially-available crystalline solar cells.

In Experimental Example 3, the boron-containing amorphous silicon powder 2b was applied to the substrate 3, the phosphorus-containing amorphous silicon film 2d was formed thereon, and the laminated film was made into the polycrystalline silicon film 4. On the other hand, when silicon powder containing phosphorus (P) or arsenic (As) may be applied to the substrate 3, a boron-containing amorphous silicon film 2d may be formed thereon, and the laminated film may be made into a polycrystalline silicon film 4, the same advantages can be achieved.

INDUSTRIAL APPLICABILITY

According to the invention, it is possible to efficiently provide a solar cell panel having a large area at a low cost. The silicon sputtering target provided by the invention can be used as a silicon material of a crystalline solar cell. According to the invention, it is possible to efficiently provide a solar cell panel having a large area at a low cost.

REFERENCE SIGNS LIST

1: SILICON INGOT
2a: CRUDE SILICON POWDER
2b: SILICON POWDER
2c: SILICON TARGET
2d: AMORPHOUS SILICON FILM
2e: AMORPHOUS SILICON FILM

3: SUBSTRATE
4: POLYCRYSTALLINE SILICON FILM
5: TEXTURED STRUCTURE
6: SURFACE LAYER OF POLYCRYSTALLINE SILICON FILM
7: INSULATING FILM
8: ELECTRODE
10: BASE
20: NEGATIVE ELECTRODE
21: POSITIVE ELECTRODE
22: PLASMA JETTING PORT
23: PLASMA
30: SILICON INGOT
31: WIRE
40: SILICON POSITIVE ELECTRODE
41: ARC DISCHARGE
42: SILICON PARTICLE
43: ARGON GAS
44: TRANSPORT PIPE
45: SUPPORT SUBSTRATE
46: HIGH-TEMPERATURE PLASMA
47: HALOGEN LAMP
48: SEPARATION CHAMBER
49: POLYCRYSTALLINE SILICON FILM
50: ATMOSPHERIC PRESSURE PLASMA APPARATUS
51: VACUUM CHAMBER
54: SUBSTRATE SUPPORT TOOL
55: GAS INTRODUCTION DEVICE
56: EXHAUST EQUIPMENT
57: EXHAUST PORT
58: VALVE
59: EARTH SHIELD
60: MAGNETIC CIRCUIT
61: WATER-COOLING JACKET
62: HIGH-VOLTAGE POWER SOURCE
63: PACKING PLATE
100: MAGNETRON SPUTTERING APPARATUS

The invention claimed is:

1. A method of manufacturing a polycrystalline solar cell panel, comprising:
  step A of preparing a P-type or N-type silicon target;
  step B of forming a P-type or N-type amorphous silicon film on the surface of a substrate using the P-type or N-type silicon target through sputtering; and
  step C of scanning the P-type or N-type amorphous silicon film with plasma to melt the P-type or N-type amorphous silicon film and then re-crystallizing the melted P-type or N-type amorphous silicon film to form a P-type or N-type polycrystalline silicon film,
  the step A including obtaining a P-type silicon target through a step of pulverizing a P-type silicon ingot containing boron and having a purity of 99.999 wt % or more to form P-type silicon powder having a purity of 99.999 wt % or more, a step of exposing the P-type silicon powder to plasma to form P-type molten silicon, and a step of re-crystallizing the P-type molten silicon, or
  the step A including obtaining an N-type silicon target through a step of pulverizing an N-type silicon ingot containing phosphorus or arsenic and having a purity of 99.999 wt % or more to form N-type silicon powder having a purity of 99.999 wt % or more, a step of exposing the N-type silicon powder to plasma to form N-type molten silicon, and a step of re-crystallizing the N-type molten silicon.

2. The method of manufacturing a polycrystalline solar cell panel according to claim 1, wherein the step of pulverizing the P-type silicon ingot or the N-type silicon ingot includes a step of forming P-type silicon powder with a particle diameter of 0.1 μm to 100 μm using at least one method selected from high-pressure pure water cutting, jet milling, wet atomization, ultrasonic disintegration, and shock wave disintegration.

3. The method of manufacturing a polycrystalline solar cell panel according to claim 1, wherein the substrate contains any one of Al, Ag, Cu, Sn, Zn, In, and Fe.

4. The method of manufacturing a polycrystalline solar cell panel according to claim 1, wherein the plasma is atmospheric-pressure plasma.

5. The method of manufacturing a polycrystalline solar cell panel according to claim 1, wherein the scanning speed is in the range of 100 mm/sec to 2000 mm/sec.

6. The method of manufacturing a polycrystalline solar cell panel according to claim 1, further comprising step D of exposing the P-type polycrystalline silicon film formed in step C to plasma under a gas containing arsenic or phosphorus to form an PN junction or exposing the N-type polycrystalline silicon film formed in step C to plasma under a gas containing boron to form a PN junction.

7. A method of manufacturing a polycrystalline solar cell panel, comprising:
  step α of preparing a P-type silicon target and an N-type silicon target;
  step β of forming an amorphous laminated film of a P-type amorphous silicon film and an N-type amorphous silicon film on the surface of a substrate using the P-type silicon target and the N-type silicon target through sputtering; and
  step γ of scanning the laminated film with plasma to melt the laminated film and then re-crystallizing the melted laminated film to form a polycrystalline laminated film of a P-type polycrystalline silicon film and an N-type polycrystalline silicon film.

8. The method of manufacturing a polycrystalline solar cell panel according to claim 7, wherein step α includes:
  obtaining a P-type silicon target through a step of pulverizing a P-type silicon ingot containing boron and having a purity of 99.999 wt % or more to form P-type silicon powder having a purity of 99.999 wt % or more, a step of exposing the P-type silicon powder to plasma to form P-type molten silicon, and a step of re-crystallizing the P-type molten silicon; and
  obtaining an N-type silicon target through a step of pulverizing an N-type silicon ingot containing phosphorus or arsenic and having a purity of 99.999 wt % or more to form N-type silicon powder having a purity of 99.999 wt % or more, a step of exposing the N-type silicon powder to plasma to form N-type molten silicon, and a step of re-crystallizing the N-type molten silicon.

9. The method of manufacturing a polycrystalline solar cell panel according to claim 8, wherein the step of pulverizing the P-type silicon ingot and the N-type silicon ingot includes a step of forming P-type silicon powder with a particle diameter of 0.1 μm to 100 μm using at least one method selected from high-pressure pure water cutting, jet milling, wet atomization, ultrasonic disintegration, and shock wave disintegration.

10. The method of manufacturing a polycrystalline solar cell panel according to claim 7, wherein the substrate contains any one of Al, Ag, Cu, Sn, Zn, In, and Fe.

11. The method of manufacturing a polycrystalline solar cell panel according to claim 7, wherein the plasma is atmospheric-pressure plasma.

12. The method of manufacturing a polycrystalline solar cell panel according to claim 7, wherein the scanning speed is in the range of 100 mm/sec to 2000 mm/sec.

13. The method of manufacturing a polycrystalline solar cell panel according to claim 7, wherein step γ includes forming a PN junction in the polycrystalline laminated film.

14. A polycrystalline solar cell panel formed using the method according to claim 13.

* * * * *